(12) United States Patent
Kato

(10) Patent No.: US 9,134,350 B2
(45) Date of Patent: Sep. 15, 2015

(54) CURRENT DETECTION CIRCUIT

(71) Applicant: SANKEN ELECTRIC CO., LTD., Niiza-shi, Saitama (JP)

(72) Inventor: Yuji Kato, Saitama (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 417 days.

(21) Appl. No.: 13/749,763

(22) Filed: Jan. 25, 2013

(65) Prior Publication Data

US 2013/0193992 A1 Aug. 1, 2013

(30) Foreign Application Priority Data

Jan. 26, 2012 (JP) ................................. 2012-013742

(51) Int. Cl.
 *G01R 27/02* (2006.01)
 *H02M 3/156* (2006.01)
 *G01R 19/00* (2006.01)

(52) U.S. Cl.
 CPC ............ *G01R 19/00* (2013.01); *G01R 19/0092* (2013.01)

(58) Field of Classification Search
 None
 See application file for complete search history.

(56) References Cited

FOREIGN PATENT DOCUMENTS

JP 2003-028901 A 1/2003

*Primary Examiner* — Melissa Koval
*Assistant Examiner* — Courtney McDonnough
(74) *Attorney, Agent, or Firm* — Banner & Witcoff, Ltd.

(57) ABSTRACT

A current detection circuit comprises: a series circuit of a first current detection part series to a first semiconductor and a second current detection part, which detects current having a smaller range than the first current detection part; a second semiconductor device, which is provided with a second drive circuit, connected in parallel with the second current detection part; and a current determination circuit configured to switch between the first current detection part and the second current detection part, based on the magnitude of the detection current of the first current detection part, wherein, when the detection current of the first current detection part is larger than a predetermined value, the voltage from the first current detection part is output, and wherein, when the detection current of the first current detection part is smaller than the predetermined value, the voltage from the second current detection part is output.

10 Claims, 10 Drawing Sheets

CURRENT DETECTION CIRCUIT

CROSS-REFERENCE TO RELATED APPLICATION

This application claims priority from Japanese Patent Application No. 2012-013742 filed on Jan. 26, 2012, the entire subject matter of which is incorporated herein by reference.

TECHNICAL FIELD

This disclosure relates to a current detection circuit in a case of controlling current flowing through a load by a load drive circuit, or the like.

BACKGROUND

In response to a recent need for energy-saving, a technology for accurately detecting current with a low loss has become more important. A method for accurately detecting current with a low loss is disclosed in JP-A-2003-28901, for example.

JP-A-2003-28901 discloses a method for accurately detecting load current using a multi-source MOS as shown in FIG. 10. A multi-source MOS 2 includes a load driving MOS Q1 for controlling current to flow through a load 4 and a current detection MOS Q2 for detecting the current. The current detection MOS Q2 is formed on the same chip with the load driving MOS Q1. The structures of the current detection MOS Q2 and the load driving MOS Q1 are the same but the areas of the current detection MOS Q2 and the load driving MOS Q1 are different. A current detection circuit 3 includes an amplifier AMP, a transistor TR and a resistor R. Since the amplifier AMP controls the transistor TR so that the source voltage of the load driving MOS Q1 is equal to the source voltage of the current detection MOS Q2, the current flowing through the current detection MOS Q2 becomes a ratio of on-resistance of the load driving MOS Q1 and the current detection MOS Q2. The ratio of on-resistance is inversely proportional to a ratio of the chip size of the load driving MOS Q1 and the current detection MOS Q2.

JP-A-2003-28901 discloses that a current detection error of the current detection circuit 3 due to the offset voltage of the amplifier AMP is dependent on the current flowing through the load 4 and a means for reducing the influence of the offset voltage is provided. According to JP-A-2003-28901, in a case where the current flowing through the load 4 is large, the source-drain voltage of the load driving MOS Q1 and the current detection MOS Q2 is large and therefore the current detection voltage is increased. Accordingly, the influence of the offset voltage of the amplifier AMP is relatively small.

However, in a case where the current flowing through the load 4 is small, the source-drain voltage of the load driving MOS Q1 and the current detection MOS Q2 is also small, that is, the current detection voltage is small. Accordingly, the offset voltage of the amplifier AMP is not negligible and thus the current detection accuracy is degraded. JP-A-2003-28901 suggests a means for varying on-resistance of the load driving MOS Q1 in accordance with the current flowing through the load 4, in order to solve the situation.

Further, JP-A-2003-28901 suggests a means for canceling the offset voltage of the amplifier AMP by performing the current detection measurement twice and calculating the difference between the detection results.

FIG. 11 shows a fifth illustrative embodiment of JP-A-2003-28901. The load driving MOS Q1 uses two values of 1:0.5 as the on-resistance of the multi-source MOS. This is enabled by selectively setting a gate voltage applied to the multi-source MOS 2 from an output MOS control circuit 1. According to JP-A-2003-28901, the on-resistance of the load driving MOS is varied to 1 and 0.5 and the current flowing through the current detection MOS Q2 during each of the on-resistance is respectively detected. And, the offset voltage of the amplifier is calculated from the detection results and cancelled.

When a ratio of the on-resistance of the current detection MOS Q2 and the load driving MOS Q1 is indicated as "n", the offset voltage is indicated as "Voff" and the load current is indicated as "I", the current Iout1 to be detected by setting the on-resistance of the load driving MOS Q1 as the on-resistance of the ratio "1" in the first current measurement is represented by the following formula.

$$Iout1=(I\times\text{on-resistance}+\textit{Voff})/(n\times\text{on-resistance}) \quad (1)$$

Next, the current Iout2 to be detected by setting the on-resistance of the load driving MOS Q1 as the on-resistance of the ratio "0.5" is represented by the following formula.

$$Iout2=(I\times0.5\ \text{on-resistance}+\textit{Voff})/(n\times0.5\ \text{on-resistance}) \quad (2)$$

The detection current Iout to cancel the offset voltage can be obtained by subtracting the load current Iout1 and Iout2.

$$Iout=(2\times Iout1-Iout2)/n \quad (3)$$

SUMMARY

However, in order to arbitrarily vary the on-resistance in case that a load current information obtaining unit to vary the on-resistance of the load driving MOS Q1 in accordance with the load current and an on-resistance varying request means of the load driving MOS Q1 have not been clearly suggested in JP-A-2003-28901, it is considered that a large-scale circuit is necessary.

Further, although a configuration in which a source-drain voltage of the load driving MOS Q1 is constantly maintained by comparing a source voltage of the load driving MOS Q1 with a reference voltage 12 (not shown in FIG. 11) is shown in JP-A-2003-28901, a differential voltage between +B voltage as an input of a load driving circuit and the reference voltage 12 becomes a drain-source voltage of the load driving MOS Q1, and then it is required that a voltage drop of the load driving MOS Q1 is a constant voltage of 100 mV as indicated in a table of JP-A-2003-28901. Accordingly, a voltage drop due to flowing of the load current should be taken into consideration and also the +B voltage requires a stable voltage accuracy.

Further, in other illustrative embodiments, in general, the on-resistance of the load driving MOS Q1 is often set to a value sufficiently smaller than the resistance value of the load in order to reduce the loss of the load driving MOS Q1. Since the load current I in formula (1) is the same as in formula (2), the density of the current flowing through the load driving MOS Q1 is changed as the on-resistance of the load driving MOS Q1 is changed. When the on-resistance of the load driving MOS Q1 is large, heat is generated with increasing the current density and thus the on-resistance of the load driving MOS Q1 increases. Therefore, in formula (1) and (2), although the current detection is carried out in a condition where the on-resistance of the load driving MOS Q1 is set to half, there is no guarantee that the on-resistance has a predetermined setting value due to the heat generated, an error in the detection current may be caused. Further, a means for calculating the difference between two detection results is also necessary and thus a rear-stage circuit of the detection circuit becomes complicated.

In view of the above, this disclosure provides at least a current detection circuit having a low loss and a high-accuracy, wide dynamic range with a simple configuration.

In view of the above, a current detection circuit of this disclosure is provided in a load driving circuit that includes a first semiconductor device, which is turned on/off to control current flowing through the load on the based on a signal and is connected in series in a power supply path from a DC power supply to a load, and a first drive circuit configured to drive the first semiconductor device to be turned on/off based on the signal. The current detection circuit configured to convert current into voltage and output the converted voltage in accordance with the current flowing through the first semiconductor device, and the current detection circuit comprises: a series circuit of a first current detection part and a second current detection part, which detects current having a smaller range than the first current detection part; a second semiconductor device, which is provided with a second drive circuit, connected in parallel with the second current detection part; and a current determination circuit configured to switch between the first current detection part and the second current detection part, based on the magnitude of the detection current of the first current detection part, and to output voltage based on one of the first current detection part and the second current detection part. When the detection current of the first current detection part is larger than a predetermined value, the current determination circuit controls the second semiconductor device to be turned on via the second drive circuit and control the second current detection part to be short-circuited, so that the voltage from the first current detection part is output, and when the detection current of the first current detection part is smaller than the predetermined value, the current determination circuit controls the second semiconductor device to be turned off, so that the voltage from the second current detection part is output.

Meanwhile, a current detection circuit of this disclosure is provided in a load driving circuit that includes a first semiconductor device, which is turned on/off to control current flowing through the load on the based on a signal and is connected in series in a power supply path from a DC power supply to a load, and a first drive circuit configured to drive the first semiconductor device to be turned on/off based on the signal. The current detection circuit configured to convert current into voltage and output the converted voltage in accordance with the current flowing through the first semiconductor device, and the current detection circuit comprises: a series circuit of a first current detection part and a plurality of current detection parts, which sequentially detects current having a smaller range than the first current detection part; a plurality of semiconductor devices, each of which is provided with a plurality of drive circuits, respectively connected in parallel with the plurality of current detection parts; and a current determination circuit configured to switch to any one of the first current detection part and the plurality of current detection parts, based on the magnitude of the detection current of the first current detection part, and to output voltage based on any one of the first current detection part and the plurality of current detection parts. When the detection current of the first current detection part is larger than a predetermined value, the current determination circuit controls the plurality of semiconductor devices to be turned on via each of the plurality of drive circuits and control the plurality of current detection parts to be respectively short-circuited, so that the voltage from the first current detection part is output, and when the detection current of the first current detection part is smaller than the predetermined value, the current determination circuit controls any one the plurality of semiconductor devices to be turned off in accordance with the detection current of the first current detection part, so that the voltage from a corresponding current detection part of the plurality of current detection parts is output.

Meanwhile, a current detection circuit of this disclosure is provided in a load driving circuit that includes a first semiconductor device, which is turned on/off to control current flowing through the load on the based on a signal and is connected in series in a power supply path from a DC power supply to a load, and a first drive circuit configured to drive the first semiconductor device to be turned on/off based on the signal. The current detection circuit configured to convert current into voltage and output the converted voltage in accordance with the current flowing through the first semiconductor device, and the current detection circuit comprises: a series circuit of a first current detection part and a plurality of current detection parts, which sequentially detects current having a smaller range than the first current detection part; a plurality of semiconductor devices, each of which is provided with a plurality of drive circuits, respectively connected with the plurality of current detection parts; and a current determination circuit configured to switch to any one of the first current detection part and the plurality of current detection parts, based on the magnitude of the detection current of the first current detection part, and to output voltage based on any one of the first current detection part and the plurality of current detection parts. When the detection current of the first current detection part is larger than a predetermined value, the current determination circuit controls the plurality of semiconductor devices to be turned on via each of the plurality of drive circuits and control the plurality of current detection parts to be respectively short-circuited, so that the voltage from the first current detection part is output, and when the detection current of the first current detection part is smaller than the predetermined value, the current determination circuit controls any one the plurality of semiconductor devices to be turned off in accordance with the detection current of the first current detection part, so that the voltage from a corresponding current detection part of the plurality of current detection parts is output.

According to the current detection circuit of this disclosure, the second current detection part can detect the load current with a high-accuracy when the load current is small, whereas the second current detection part is short-circuited by a short-circuiting MOS and the first current detection part can detect the load current with a high-accuracy when the load current is large. Accordingly, it is possible to provide a current detection circuit having a low loss and a high-accuracy, wide dynamic range with a simple configuration.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Figure 1:
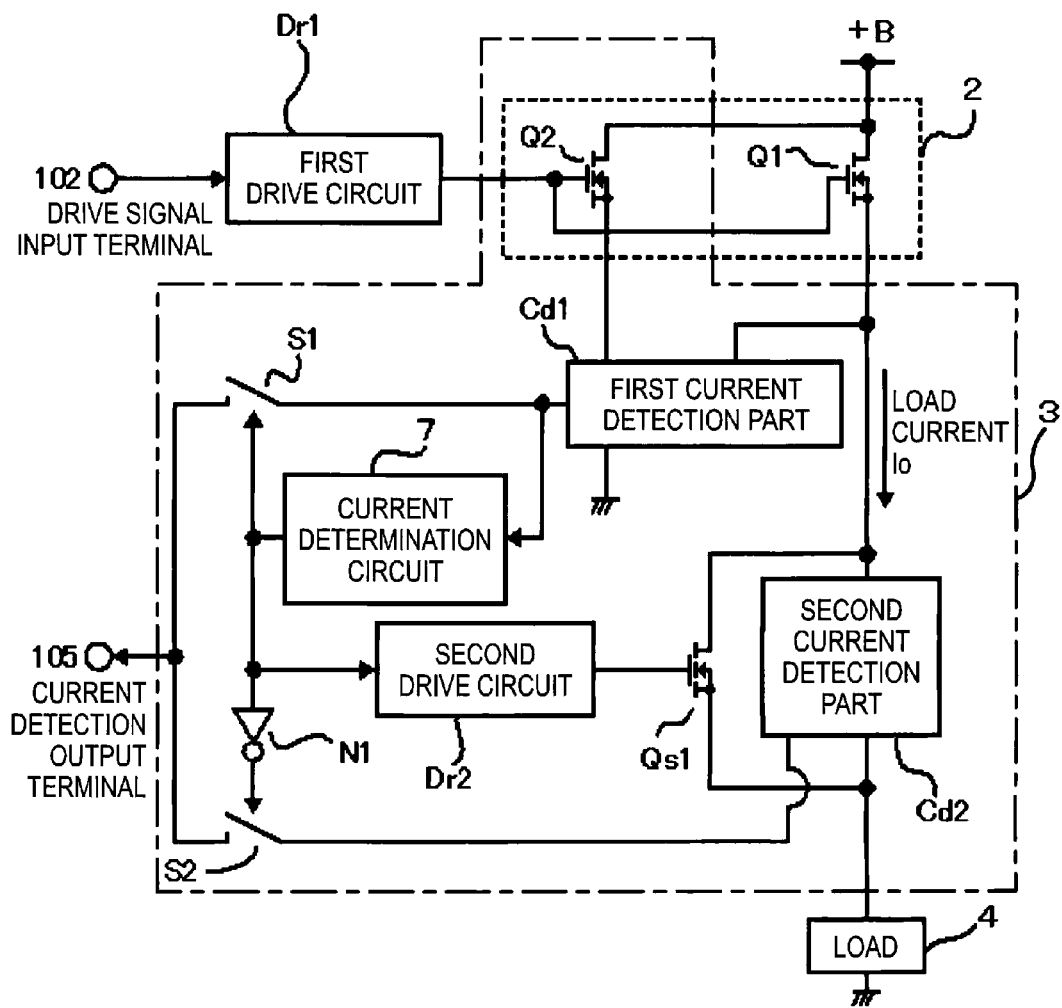
FIG. 1 is a circuit block diagram of an illustrative embodiment 1 according to this disclosure.

Hereinafter, a current detection circuit according to illustrative embodiments of this disclosure will be described in detail with reference to the accompanying drawings. In the following description of the drawings, the same or similar reference numerals are applied to the same or similar parts and elements.

Illustrative Embodiment 1

FIG. 1 is a circuit block diagram of an illustrative embodiment 1 according to this disclosure.

In the circuit block diagram shown in FIG. 1, a drive signal from an output MOS control circuit (not shown) is inputted to a drive signal input terminal 102 and then inputted to a load driving MOS Q1 via a first drive circuit Dr1. The load driving MOS Q1 controls the turn on/off of a load current Io to a load 4 via a current detection circuit 3 in accordance with the drive signal from the output MOS control circuit. The current detection circuit 3 detects the current flowing through the load driving MOS Q1 or the current detection circuit 3 and outputs the current detection signal to a current detection output terminal 105.

Here, a load driving MOS Q1 is configured by the multi-source MOS 2, which includes the load driving MOS Q1 and a current detection MOS Q2. The load driving MOS Q1 is an element for controlling current to flow through the load 4, and the current detection MOS Q2 is an element which has the same structure as the load driving MOS Q1 but has a chip size different from the load driving MOS Q1.

The current detection circuit 3 includes the current detection MOS Q2, a first current detection part Cd1, a second current detection part Cd2, a current determination circuit 7, a second drive circuit Dr2, an inverter N1, a switch S1, a switch S2 and a short-circuiting MOS Qs1.

The first current detection part Cd1 is connected to the sources of the load driving MOS Q1 and the current detection MOS Q2. Further, the source of the load driving MOS Q1 is connected to one terminal of the load 4 via a parallel circuit of the second current detection part Cd2 and the short-circuiting MOS Qs1. In addition, the first current detection part Cd1 and the other terminal of the load are connected to a ground.

An output of the first current detection part Cd1 is connected to the switch S1 and the current determination circuit 7. An output of the current determination circuit 7 is connected to a control terminal of the switch S1, the second drive circuit Dr2 and an input of the inverter N1. An output of the second drive circuit Dr2 is connected to a gate of the short-circuiting MOS Qs1 and an output of the inverter N1 is connected to a control terminal of the switch S2. The outputs of the switch S1 and the switch S2 are connected to the current detection output terminal 105. Further, an output of the second current detection part Cd2 is connected to an input of the switch S2.

When a drive signal for controlling the current to flow through the load 4 is inputted to the drive signal input terminal 102, the first drive circuit Dr1 controls the load driving MOS Q1 and the current detection MOS Q2 to be turned on. As the load driving MOS Q1 is turned on, the load current Io flows from the load driving MOS Q1 to the load 4 via the second current detection part Cd2 or the short-circuiting MOS Qs1.

Since the current determined by a ratio of on-resistance of the load driving MOS Q1 and the current detection MOS Q2 flows to the current detection MOS Q2, the first current detection part Cd1 indirectly detects the load current Io by detecting the current of the load driving MOS Q1. The current signal detected by the first current detection part Cd1 is outputted as a first current detection result to the current determination circuit 7 and the switch S1.

When the current determination circuit 7 determines that a first current detection signal from the first current detection part Cd1 to detect the load current Io is larger than one predetermined value, the current determination circuit 7 generates a signal for controlling the switch S1 and the short-circuiting MOS Qs1 to be turned on and also transmits the signal to the inverter N1. Accordingly, the switch S2 is turned off by the inverter N1 and the first current detection signal is outputted to the current detection output terminal 105. When the load current Io is large, the influence of the offset voltage of the first current detection part Cd1 on the current detection accuracy is small and thus a high-accuracy current detection becomes possible.

The second drive circuit Dr2 is a circuit intended to control the short-circuiting MOS Qs1 to be turned on/off. When the current determination circuit 7 determines that the load current Io is larger than a predetermined value, the current determination circuit 7 transmits a control signal for controlling the short-circuiting MOS Qs1 to be turned on to the second drive circuit Dr2. When the short-circuiting MOS Qs1 is turned on, the load current Io does not flow through the second current detection part Cd2 but flows through the short-circuiting MOS Qs1. Accordingly, it is possible to reduce the loss which occurs when the load current Io is large.

Meanwhile, when the current determination circuit 7 determines that the load current Io is smaller than one predetermined value, based on the first current detection signal of the first current detection part Cd1, the current determination circuit 7 generates a signal for controlling the switch S1 to be turned off and outputs a control signal for controlling the short-circuiting MOS Qs1 to be turned off to the second drive circuit Dr2. Since the short-circuiting MOS Qs1 is turned off, the load current Io flows to the load via 4 the second current detection part Cd2. The load current Io is detected by the second current detection part Cd2 and the second current detection signal is outputted to the switch S2.

That is, when the load current is smaller than one predetermined value, the current determination circuit 7 causes the switch S2 to be turned on and the switch S1 to be turned off via the inverter N1. Accordingly, the second current detection signal is outputted to the current detection output terminal 105.

Further, although the short-circuiting MOS Qs1 is turned off and thus the load current Io flows to the second current detection part Cd2, the load current Io is small and therefore the loss caused by the second current detection part Cd2 is small.

Further, when the load current Io is small, the current detection accuracy is degraded by the offset voltage of the first current detection part Cd1. However, it is possible to maintain the current detection accuracy by providing a performance to detect the load current with a high-accuracy when the load current Io flowing through the second current detection part Cd2 is small.

Figure 2:
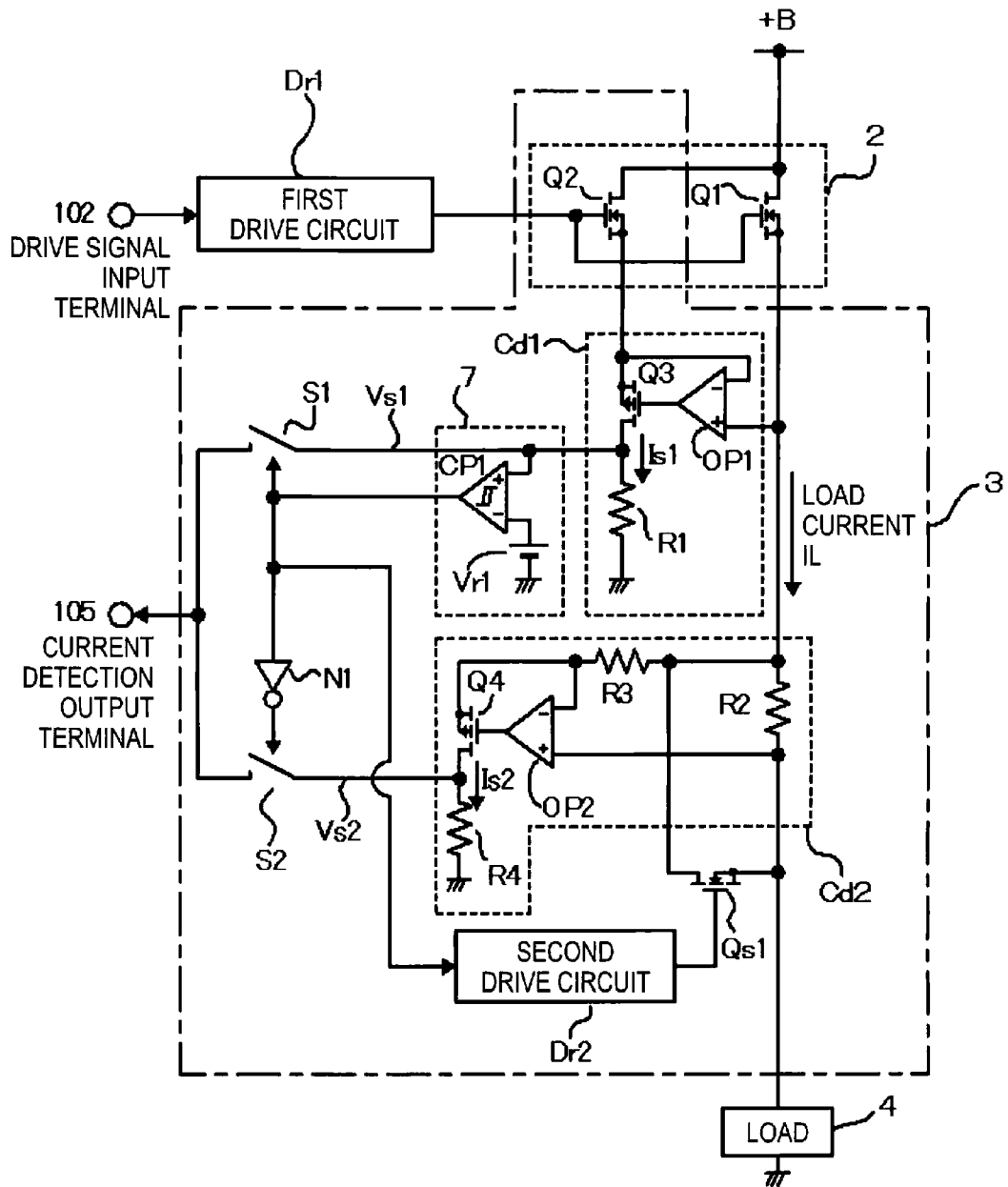
FIG. 2 is a detailed circuit configuration diagram of the illustrative embodiment 1 according to this disclosure.

As a specific example, a detailed circuit configuration diagram of the illustrative embodiment 1 according to this disclosure is shown in FIG. 2. In FIG. 2, the same or similar element will be denoted by the same reference numeral as that in FIG. 1 and the duplicated explanation thereof will be omitted.

First, an operation of the circuit in case that the load current Io is large is described. The first current detection part Cd1 includes an amplifier OP1, a P-type MOS Q3 and a resistor R1. A non-inverting input terminal of the amplifier OP1 is connected to a source terminal of the load driving MOS Q1 and an inverting terminal thereof is connected to a source terminal of the current detection MOS Q2. The amplifier OP1 controls the P-type MOS Q3 so that the voltage of the source terminal of the current detection MOS Q2 is equal to the voltage of the source terminal of the load driving MOS Q1. Accordingly, a detection current Is1 flowing through the current detection MOS Q2 is proportional to the on-resistance of the load driving MOS Q1 and the current detection MOS Q2 relative to the load current Io.

The detection current Is1 when an offset voltage is applied to the amplifier OP1 is represented as the formula (1), as described above. As mentioned in the description of the background art, when the load current Io is large, the influence of the offset voltage of the amplifier OP1 on the current detection accuracy is small.

The second current detection part Cd2 includes an amplifier OP2, detection resistors R2, R3, R4 and a P-type MOS Q4. The detection resistor R2 is connected between a source of the load driving MOS Q1 and the load, and the short-circuiting MOS Qs1 is connected in parallel to both ends of the detection resistor R2. A source terminal of the load driving MOS Q1 is connected to a connection point of the detection resistor R2 and a drain of the short-circuiting MOS Qs1, and also connected to a source of the P-type MOS Q4 via the resistor R3 resistor R3. A drain of the P-type MOS Q4 is connected to a ground via the resistor R4. Also, the drain of the P-type MOS Q4 is connected to the current detection output terminal 105 via the switch S2. A non-inverting input terminal of the amplifier OP2 is connected to a connection point of the detection resistor R2 and the load 4 and an inverting input terminal thereof is connected to a connection point of the resistor R3 and the source of the P-type MOS Q4. An output terminal of the amplifier OP2 is connected to a gate of the P-type MOS Q4. Here, the amplifier OP2 is operated to eliminate the potential difference between the non-inverting terminal and the inverting terminal, that is, the amplifier OP2 controls the P-type MOS Q4 so that the voltage drop of the resistor R3 is equal to the voltage drop of the detection resistor R2. Accordingly, it is possible to obtain the current flowing through the detection resistor R2 as a detection current Is2 which is proportional to (is reduced by) the resistance value of the resistor R3 in accordance with a resistance ratio of the detection resistor R2 and the resistor R3.

When the load current Io flows through the detection resistor R2, the voltage difference proportional to the load current Io occurs across the detection resistor R2. When the load current Io is indicated as "IL" and the detection resistor R2 is indicated as "Rs", the voltage difference V2 across the detection resistor R2 is represented by the following formula.

$$Vs = IL \times Rs \quad (4)$$

The amplifier OP2 is operated so that the non-inverting input terminal and the inverting terminal have the same potential. When the resistor R3 is indicated as "Rg" and an offset voltage Voff2 is generated in the amplifier OP2, the detection current Is2 is represented by the following formula.

$$Is2 = (Vs + Voff2)/Rg = (IL \times Rs + Voff2)/Rg \quad (5)$$

In this case, by increasing the detection resistor R2 (Rs in the formula (5)), it is possible to reduce the influence of the offset voltage Voff2 of the amplifier OP2 on the current detection accuracy. The detection current Is2 flows to the resistor R4 via the P-type MOS Q4 and is converted into a second detection voltage Vs2.

A first detection voltage Vs1 is inputted to the current determination circuit 7. The current determination circuit 7 includes a hysteresis comparator CP1 and a reference voltage source Vr1. An inverting terminal of the hysteresis comparator CP1 is connected to a positive pole of the reference voltage source Vr1 and a non-inverting terminal thereof is connected to an output of the first current detection part Cd1 and one terminal of the switch S1.

When the first detection voltage Vs1 is larger than the voltage of the reference voltage source Vr1, the hysteresis comparator CP1 transmits a control signal for controlling the switch S1 to be closed and the short-circuiting MOS Qs1 to be turned on to the switch S1 and the second drive circuit Dr2. The control signal opens the switch S2 via the inverter N1 and therefore the second detection voltage Vs2 outputted from the second current detection part Cd2 is not outputted to the current detection output terminal 105. Accordingly, the current value detected by the first current detection part Cd1 is outputted to the current detection output terminal 105. Furthermore, since the short-circuiting MOS Qs1 is turned on, the load current Io flows through the short-circuiting MOS Qs1 without passing through the detection resistor R2. Accordingly, it is possible to suppress the occurrence of a loss in the detection resistor R2.

Next, an operation of the circuit in case that the load current Io is small is described. When the load current Io is small, the first detection voltage Vs1 of the first current detection part Cd1 is also small. In a case where the first detection voltage Vs1 is smaller than the voltage value of the reference voltage source Vr1 included in the current determination circuit 7, the hysteresis comparator CP1 outputs a control signal for controlling the switch S1 to be opened and the short-circuiting MOS Qs1 to be turned off. Since the switch S1 is opened, the first detection voltage Vs1 is not outputted to the current detection output terminal 105. Further, since the short-circuiting MOS Qs1 is turned off by the second drive circuit Dr2, the load current Io flows to the detection resistor R2. As the load current Io flows through the detection resistor R2, the load current Io is detected by the second current detection part Cd2 as described above and thus the second detection voltage Vs2 is outputted to the switch S2. Since the control signal at the output of the hysteresis comparator CP1 included in the current determination circuit 7 closes the switch S2 via the inverter N1, the second detection voltage Vs2 is outputted to the current detection output terminal 105. Although the load current Io flows through the detection resistor R2, the load current Io is small. Accordingly, it is possible to reduce a loss caused by the detection resistor R2, even if the second detection voltage is set to be substantially equal to the first detection voltage to detect a large load current Io.

As described above, when the load current Io is small, the second current detection part Cd2 including the detection resistor R2 can detect the load current with a high-accuracy, and when the load current Io is large, the detection resistor R2 is short-circuited by the short-circuiting MOS Qs1 and therefore the first current detection part Cd1 can detect the load current with a high-accuracy. Accordingly, it is possible to provide the current detection circuit having a low loss and a high-accuracy, wide dynamic range.

Figure 3:
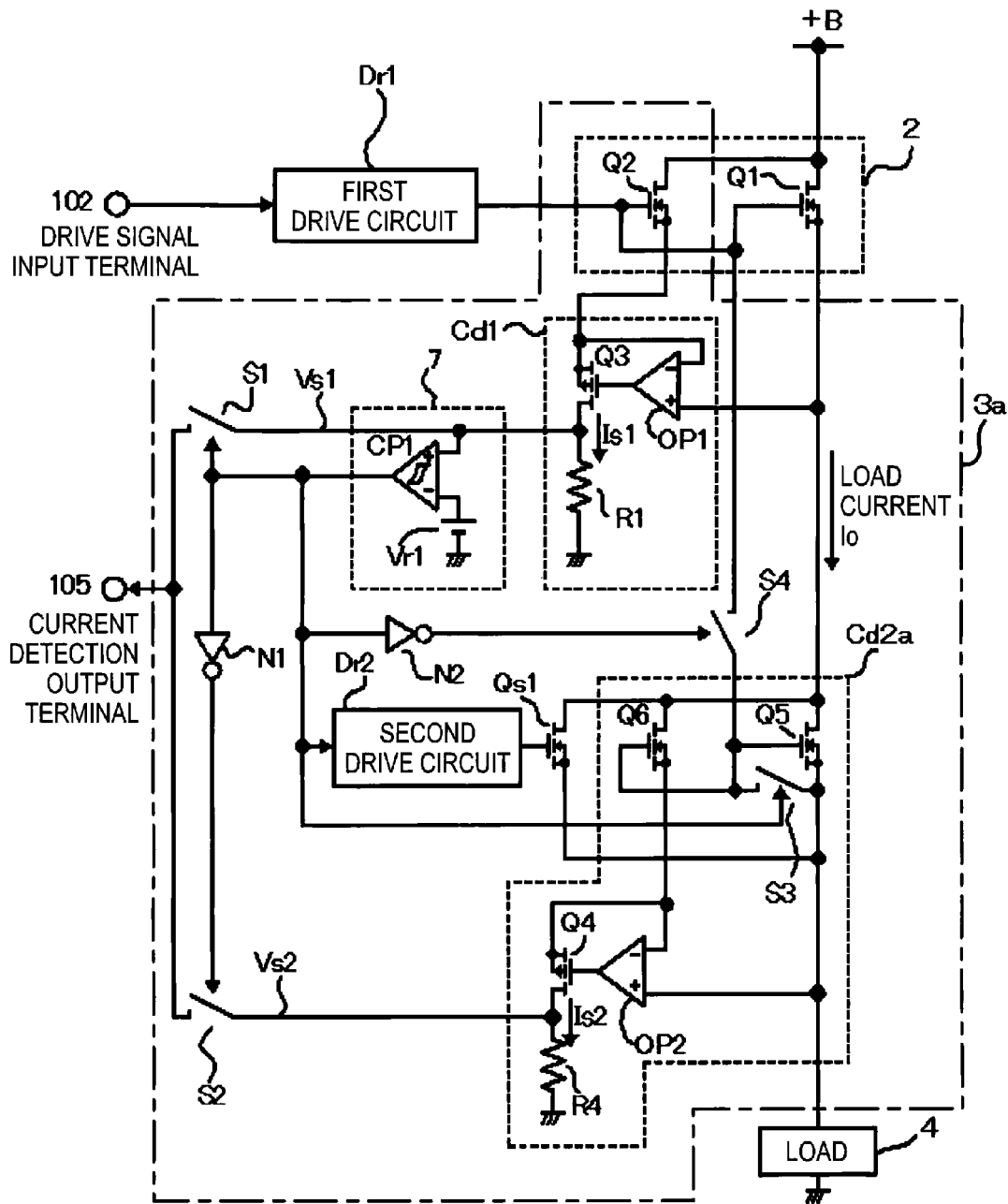
FIG. 3 is a circuit configuration diagram of an application example of the illustrative embodiment 1 according to this disclosure.

FIG. 3 is a circuit configuration diagram of an application example of the illustrative embodiment 1 according to this disclosure.

In FIG. 3, the same or similar element will be denoted by the same reference numeral as that in FIG. 2 and the duplicated explanation thereof will be omitted. FIG. 2 and FIG. 3 are different in a configuration of a second current detection part Cd2a. The second current detection part Cd2a includes the amplifier OP2, a second load driving MOS Q5, a second current detection MOS Q6, the P-type MOS Q4 and the resistor R4. The second current detection MOS Q6 is formed on the same chip with the second load driving MOS Q5. The structures of the second current detection MOS Q6 and the second load driving MOS Q5 are the same but the areas of the second current detection MOS Q6 and the second load driving MOS Q5 are different. The second load driving MOS Q5 has a chip size smaller than the load driving MOS Q1 and thus the on-resistance of the second load driving MOS Q5 is set to be larger than the on-resistance of the load driving MOS Q1. When the load current Io flows through the second load driving MOS Q5, the voltage difference proportional to the load current Io occurs across the second load driving MOS Q5. The non-inverting input terminal of the amplifier OP2 is connected to a source terminal of the second load driving MOS Q5 and the inverting terminal of the amplifier OP2 is connected to a source of the second current detection MOS Q6. The amplifier OP2 is controlled so that the source voltage of the second load driving MOS Q5 and the source voltage of the second current detection MOS Q6 have the same potential. In accordance with a ratio of the on-resistance of the second load driving MOS Q5 and the second current detection MOS Q6, the detection current Is2 flows to the resistor R4 via the P-type MOS Q4 and is converted into the second detection voltage Vs2.

First, an operation of the circuit in case that the load current Io is large is described. The first current detection part Cd1 includes the amplifier OP1, the P-type MOS Q3 and the resistor R1. The non-inverting input terminal of the amplifier OP1 is connected to the source terminal of the load driving MOS Q1 and the inverting terminal thereof is connected to the source terminal of the (first) current detection MOS Q2. The amplifier OP1 controls the P-type MOS Q3 so that the voltage of the source terminal of the first current detection MOS Q2 is equal to the voltage of the source terminal of the load driving MOS Q1. Accordingly, the detection current Is1 flowing through the first current detection MOS Q2 is proportional to the on-resistance of the load driving MOS Q1 and the first current detection MOS Q2 relative to the load current Io. The detection current Is1 when an offset voltage is applied to the amplifier OP1 is represented as the formula (1), as described above. As mentioned in the description of the background art, when the load current Io is large, the influence of the offset voltage of the amplifier OP1 on the current detection accuracy is small.

The first detection voltage Vs1 is inputted to the current determination circuit 7. The current determination circuit 7 includes the hysteresis comparator CP1 and the reference voltage source Vr1. When the load current Io is large, the first detection voltage Vs1 becomes larger than the voltage of the reference voltage source Vr1 and thus the hysteresis comparator CP1 outputs a high-level control signal. In accordance with the control signal, the switch S1 and a switch S3 are closed, the switch S2 is opened via the inverter N1, a switch S4 is opened via an inverter N2 and the short-circuiting MOS Qs1 is turned on via the second drive circuit Dr2. Since the switch S4 is opened and the switch S3 is closed, a gate-source voltage difference of the second load driving MOS Q5 becomes 0 V and the whole load current Io flows to the short-circuiting MOS Qs1. When the second load driving MOS Q5 is turned off, the amplifier OP2 is operated to control the source terminals of the second load driving MOS Q5 and the second current detection MOS Q6 to have the same potential and thus the P-type MOS Q4 is turned off. When the P-type MOS Q4 is turned off, current does not flow through the resistor R4 and thus the second detection voltage Vs2 becomes 0 V. However, since the switch S2 is opened, the second detection voltage Vs2 is not outputted to the current detection output terminal 105. Since the switch S1 is closed, the first detection voltage Vs1 is outputted to the current detection output terminal 105.

When the load current Io is large, the influence of the offset voltage of the amplifier OP1 on the current detection accuracy is small. Accordingly, it is possible to detect the current with a high-accuracy. Further, it is also possible to reduce a loss by the load driving MOS Q1.

Next, an operation of the circuit in case that the load current Io is small is described. When the load current Io is small, the first detection voltage Vs1 is also small. As a result, the hysteresis comparator CP1 determines that the first detection voltage Vs1 is smaller than the reference voltage source Vr1 and thus the hysteresis comparator CP1 outputs a low-level control signal. When the hysteresis comparator CP1 outputs the low-level control signal, the switch S1 and the switch S3 are opened, the switch S2 is closed via the inverter N1, the switch S4 is closed via the inverter N2, and the short-circuiting MOS Qs1 is turned off via the second drive circuit Dr2. Since the switch S4 is closed and the switch S3 is opened, the second load driving MOS Q5 and the second current detection MOS Q6 are turned on. Further, since the short-circuiting MOS Qs1 is turned off, the load current Io flows to the second load driving MOS Q5. As the load current Io flows through the second load driving MOS Q5, the second detection current Is2 flows to the second current detection MOS Q6, the P-type MOS Q4 and the resistor R4, and the second detection voltage Vs2 is outputted from the second current detection part Cd2a. When the load current Io is small, the switch S1 is opened and the switch S2 is closed. Accordingly, the second detection voltage Vs2 is outputted to the current detection output terminal 105.

By setting the on-resistance of the second load driving MOS Q5 to a value larger than the on-resistance of the first load driving MOS Q1, a sufficient voltage drop occurs between the drain and source of the second load driving MOS Q5, even when the load current Io is small. In this manner, the influence of the offset voltage of the amplifier OP2 is reduced and thus it is possible to detect the load current Io with a high-accuracy. Further, since the load current Io is small, the loss caused by the second load driving MOS Q5 is low.

Illustrative Embodiment 2

Figure 4:
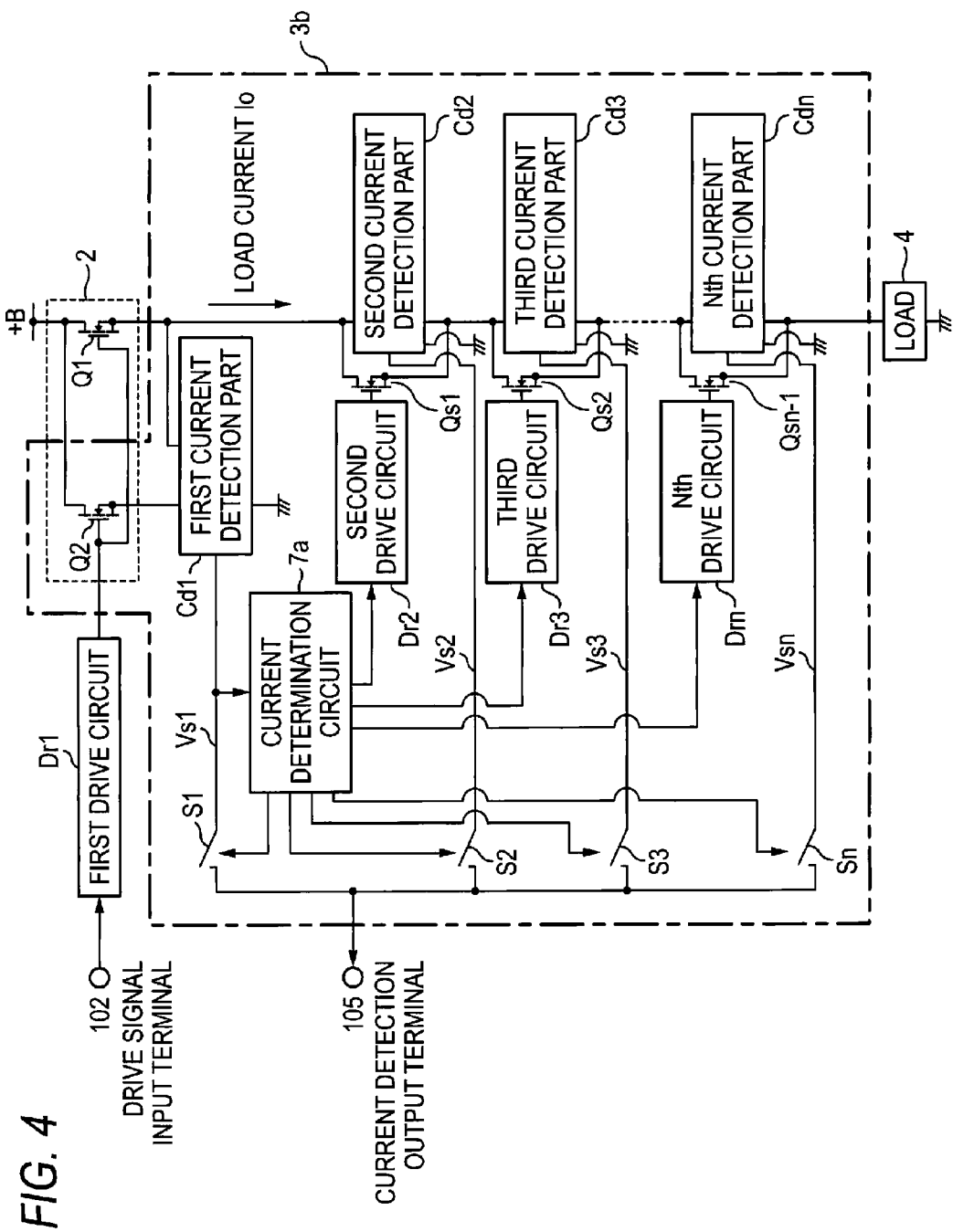
FIG. 4 is a circuit block diagram of an illustrative embodiment 2 according to this disclosure.
Figure 5:
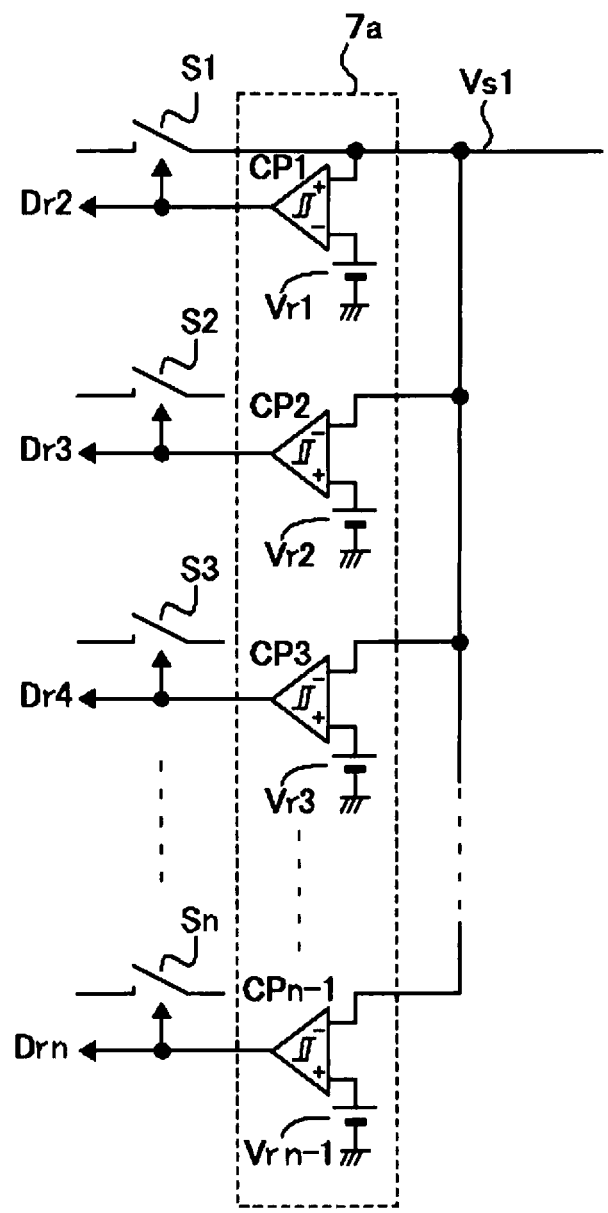
FIG. 5 is an example of a detailed circuit diagram of a current determination circuit 7a shown in FIG. 4.

FIG. 4 is a circuit block diagram of an illustrative embodiment 2 according to this disclosure. FIG. 5 is an example of a detailed circuit diagram of a current determination circuit 7a shown in FIG. 4. In FIG. 4 and FIG. 5, the same or similar element will be denoted by the same reference numeral as that in FIG. 2 and the duplicated explanation thereof will be omitted. The illustrative embodiment 2 is from the illustrative embodiment 1 in that "n" current detection parts connected in series are provided. The first current detection part Cd1 has a performance to carry out the current detection with a low loss and a high-accuracy when the load current Io is the largest. And, the second current detection part Cd2, a third current detection part Cd3, . . . , an Nth current detection part Cdn respectively have a performance to carry out the current detection as the load current Io becomes smaller.

Further, a current determination circuit 7a shown in FIG. 5 includes hysteresis comparators CP1 to CPn−1 and reference voltage sources Vr1 to Vrn−1. The voltages of the reference voltage sources Vr1 to Vrn−1 are represented by Vr1>Vr2>Vr3> . . . >Vrn−1. The current determination circuit 7a is set so that any one of the hysteresis comparators CP1 to CPn−1 outputs a high-level control signal in accordance with the magnitude of the first detection voltage Vs1 from the first current detection part Cd1. That is, when the load current Io is decreased, any one of the second current detection part Cd2, the third current detection part Cd3, . . . , the Nth current detection part Cdn is driven in accordance with the magnitude of the load current Io.

Hereinafter, an operation of the illustrative embodiment 2 in case that the load current Io is decreased is described. In a case where the load current Io is decreased and thus the current detection accuracy of the first current detection part Cd1 is degraded, a current detection circuit 3b is operated so that the second current detection part Cd2 detects the load current Io and the detection result of the second current detection part Cd2 is outputted to the current detection output terminal 105 by closing only the switch S2 and opening the switch S1 and switches S3 to Sn. Furthermore, when the load current Io is decreased and the current determination circuit 7a detects the decrease of the load current Io, the current determination circuit 7a is operated so that the third current detection part Cd3 can detect the load current Io and thus the third detection voltage Vs3 is outputted to the current detection output terminal 105 by turning off a short-circuiting MOS Qs2, closing the switch S3 and opening the switch S1, the switch S2 and the switches S4 to Sn.

As the load current Io is decreased, the current detection part to perform the detection is switched from the first current detection part Cd1 toward the Nth current detection part Cdn. As a result, it is possible to obtain the characteristic diagram of load current-current detection accuracy shown in FIG. 6.

Figure 6:
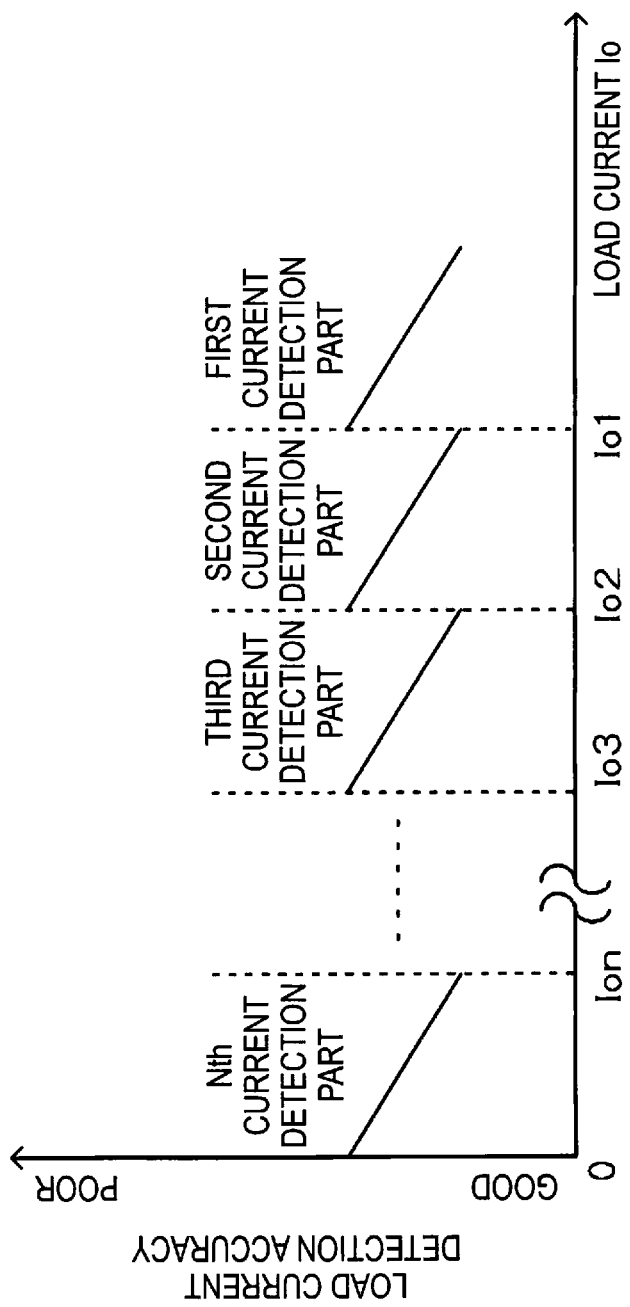
FIG. 6 is a characteristic diagram showing load current-current detection accuracy according to the illustrative embodiment 2.

FIG. 6 shows the switching of the current detection part to any one of the first current detection part Cd1 to the Nth current detection part Cdn by the equally spaced current values relative to the load current Io. This result can be obtained by setting the voltage of the reference voltage sources Vr1 to Vrn−1 of the current determination circuit 7a shown in FIG. 6 to a value sequentially lowered at a constant voltage interval.

Here, the voltage of the reference voltage sources Vr1 to Vrn−1 may be set at a larger voltage interval as being lowered, instead of the constant voltage intervals. The reason is as follows. That is, the current detection accuracy of the first current detection part Cd1 at a low current is decreased and thus there is a risk that a switching point of the load current Io to switch the current detection part to any one of the first current detection part Cd1 to the Nth current detection part Cdn is varied. As a result, when a switching point of the Nth current detection part Cdn is smaller than a setting value, a current detection range of the N−1th current detection part Cdn−1 becomes a narrower load current range and thus the current detection accuracy is degraded. Accordingly, when the voltage of the reference voltage sources Vr1 to Vrn−1 is set at a larger voltage interval as being lowered, the current detection range of the Nth current detection part Cdn to detect a low current becomes wider and thus it is possible to suppress the current detection accuracy from becoming larger than a setting current detection accuracy. Here, power loss of the Nth current detection part Cdn at this time is not a problem since the load current Io is small.

As described above, it is possible to increase the current detection accuracy by using an optimal current detection part of the current detection parts Cd1 to Cdn according to the magnitude of the load current Io.

Illustrative Embodiment 3

Figure 7:
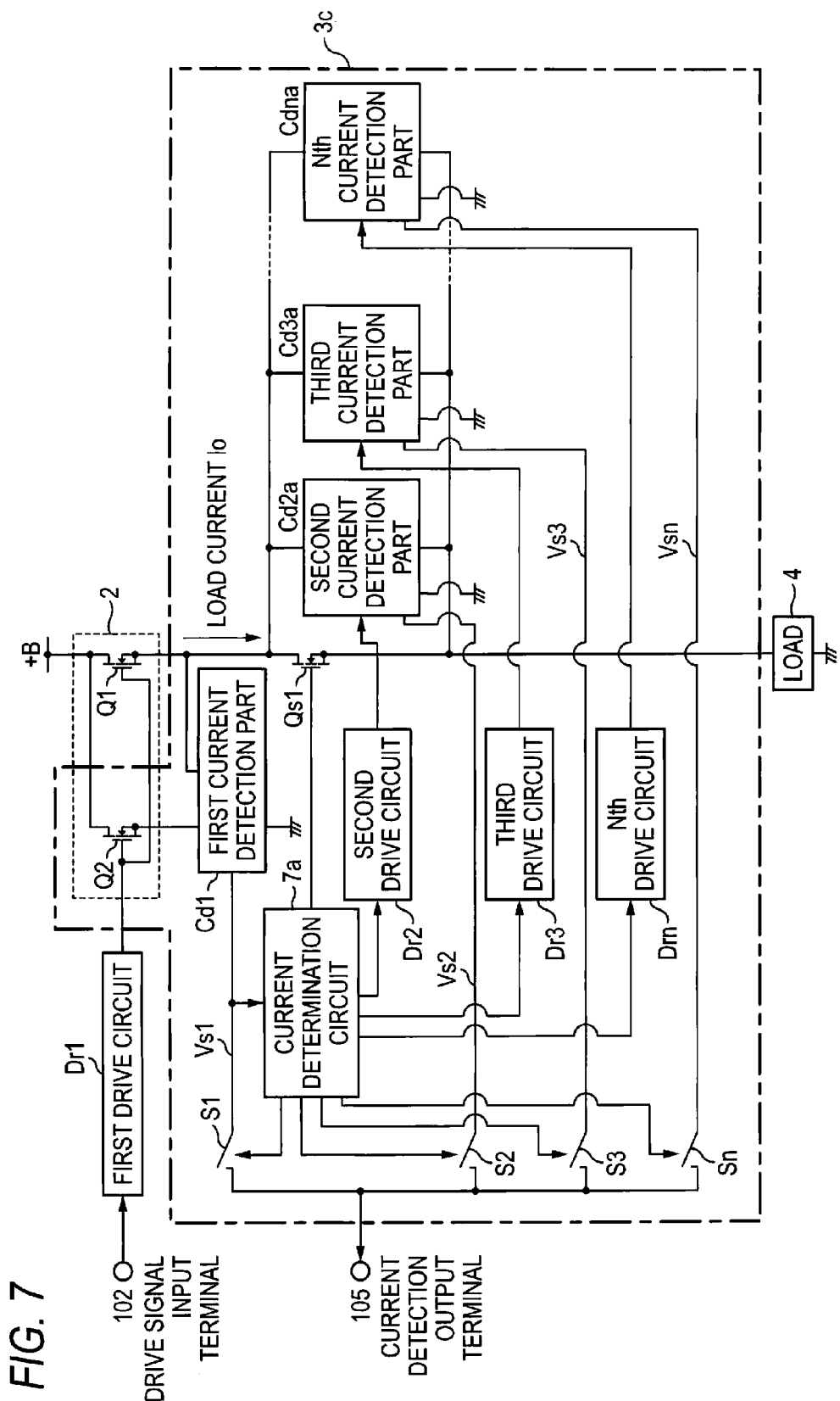
FIG. 7 is a circuit block diagram of an illustrative embodiment 3 according to this disclosure.

FIG. 7 is a circuit block diagram of an illustrative embodiment 3 according to this disclosure. In FIG. 7, the same or similar element will be denoted by the same reference numeral as that in FIG. 4 and the duplicated explanation thereof will be omitted.

The illustrative embodiment 3 is different from the illustrative embodiment 2 in that a second current detection part Cd2a to an Nth current detection part Cd2n are connected in parallel at a connection point of the second current detection part Cd2. Further, the second current detection part Cd2a to the Nth current detection part Cd2n have the same configuration as the second current detection part Cd2a shown in FIG. 3, which is an application example of the illustrative embodiment 1. For example, the second current detection part Cd2a includes the amplifier OP2, the second load driving MOS Q5, the second current detection MOS Q6, the P-type MOS Q4 and the resistor R4. Since a current detection operation of the second current detection part Cd2a has been described in the application example of the illustrative embodiment 1, a description thereof is omitted.

The first current detection part Cd1 has a performance to carry out the current detection with a low loss and a high-accuracy when the load current Io is the largest. And, the second current detection part Cd2a, the third current detection part Cd3a, . . . , the Nth current detection part Cdna respectively have a performance to carry out the current detection as the load current Io becomes smaller. Although not shown, load driving MOSs Q1 to Q3n−1 are provided. On-resistance of the first load driving MOS Q1 is the smallest and on-resistance of the Nth load driving MOS Q3n−1 is the largest. The current value detected by the first current detection part Cd1 is transmitted to the current determination circuit 7a. The current determination circuit 7a switches the short-circuiting MOSs Qs1 to Qsn−1 in accordance with the current value detected by the first current detection part Cd1.

First, when the load current Io is the largest, the current determination circuit 7a turns on the short-circuiting MOS Qs1, turns off the second drive circuit Dr2 to the Nth drive circuit Drn, closes the switch S1 and opens the switches S2 to Sn, so that the output voltage Vs1 of the first current detection part Cd1 is outputted to the current detection output terminal 105. Furthermore, when the load current Io becomes small and thus is detected by the second current detection part Cd2a, the current determination circuit 7a turns on the second load driving MOS Q5, turns off the third load driving MOS Q8 to the Nth load driving MOS Q3n−1, opens the switches other than the switch S2 and closes only the switch S2, so that the output voltage Vs2 of the second current detection part Cd2a is outputted to the current detection output terminal 105. Accordingly, the second current detection part Cd2a can detect the load current Io with high-accuracy.

In this way, as the load current Io is decreased, the current detection part to perform the detection is switched from the first current detection part Cd1 toward the Nth current detection part Cdna. As a result, it is possible to obtain the relationship of load current-load current detection accuracy as shown in FIG. 6. As is apparent from FIG. 6, according to the operation of this circuit, it is possible to always obtain the high current detection accuracy by using an optimal current detection part of the current detection parts Cd1 to Cdna according to the magnitude of the load current Io. Further, similarly to the illustrative embodiment 2, the voltage of the reference voltage sources Vr1 to Vrn−1 may be set at a constant voltage interval or may be set at a larger voltage interval as being lowered.

Illustrative Embodiment 4

Figure 8:
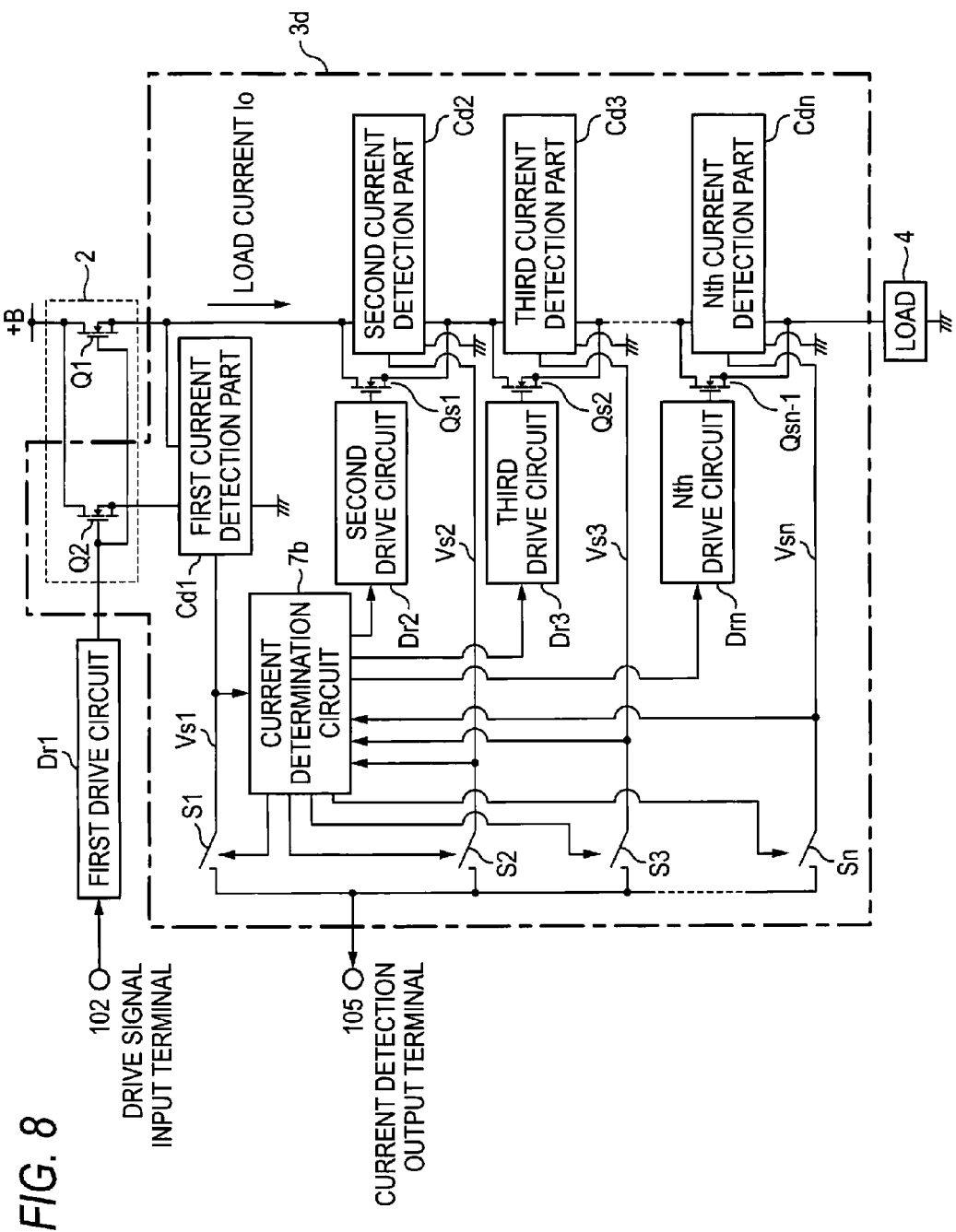
FIG. 8 is a circuit block diagram of an illustrative embodiment 4 according to this disclosure.

FIG. 8 is a circuit block diagram of an illustrative embodiment 4 according to this disclosure. In FIG. 8, the same or similar element will be denoted by the same reference numeral as that in FIG. 4 and the duplicated explanation thereof will be omitted. The illustrative embodiment 4 is different from the illustrative embodiment 2 in that the current detection output from the second current detection part Cd2 to the Nth current detection part Cdn is connected to the current determination circuit 7b.

Figure 9:
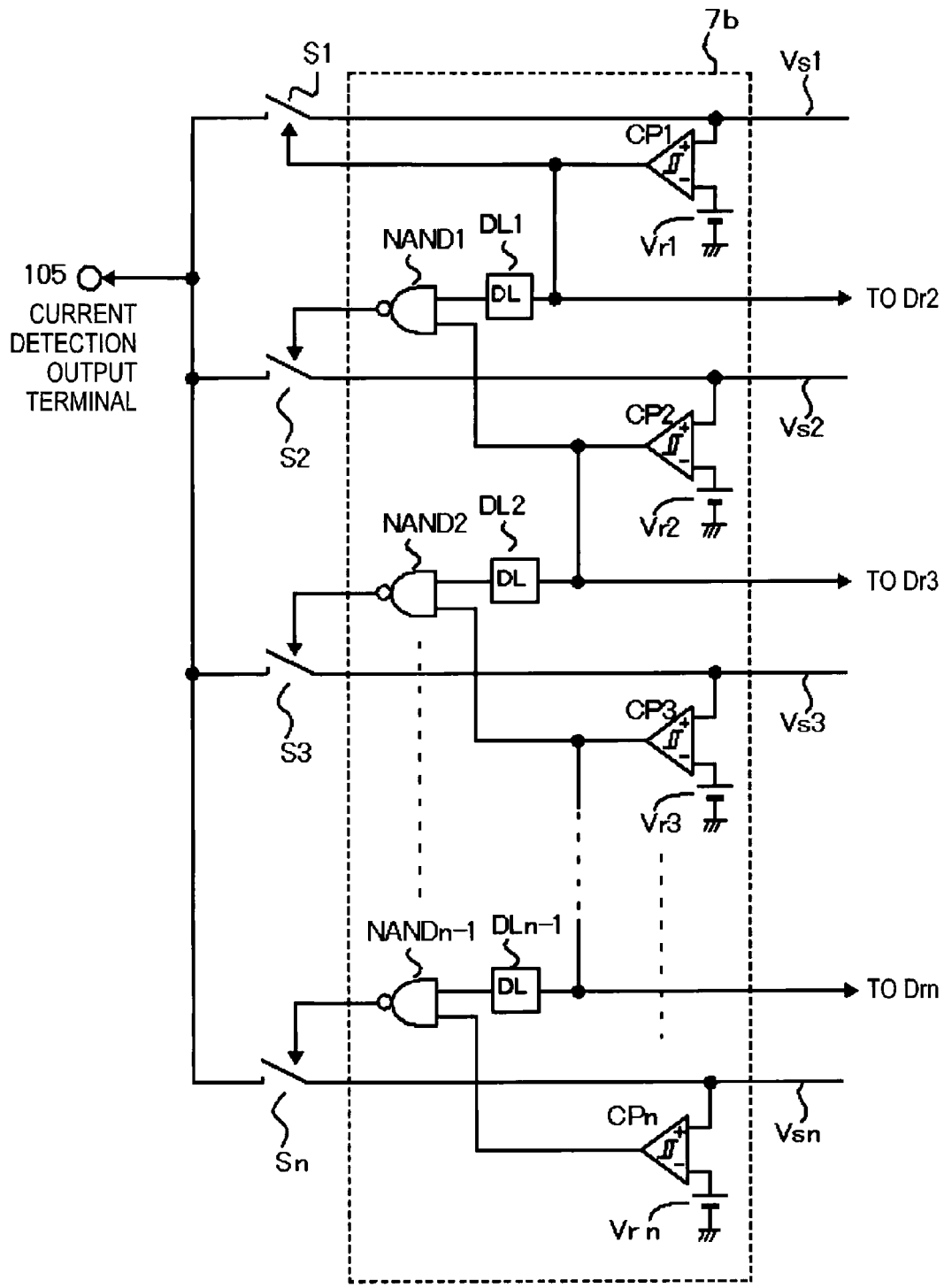
FIG. 9 is an example of a detailed circuit diagram of a current determination circuit 7b according to the illustrative embodiment 4.
Figure 10:
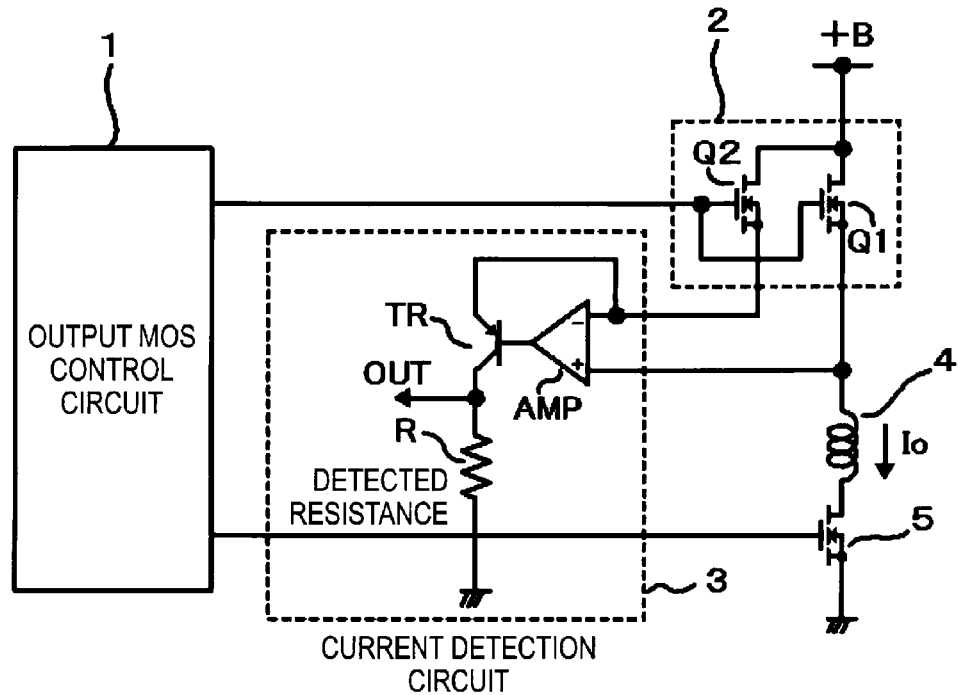
FIG. 10 is a circuit configuration diagram showing a related art.
Figure 11:
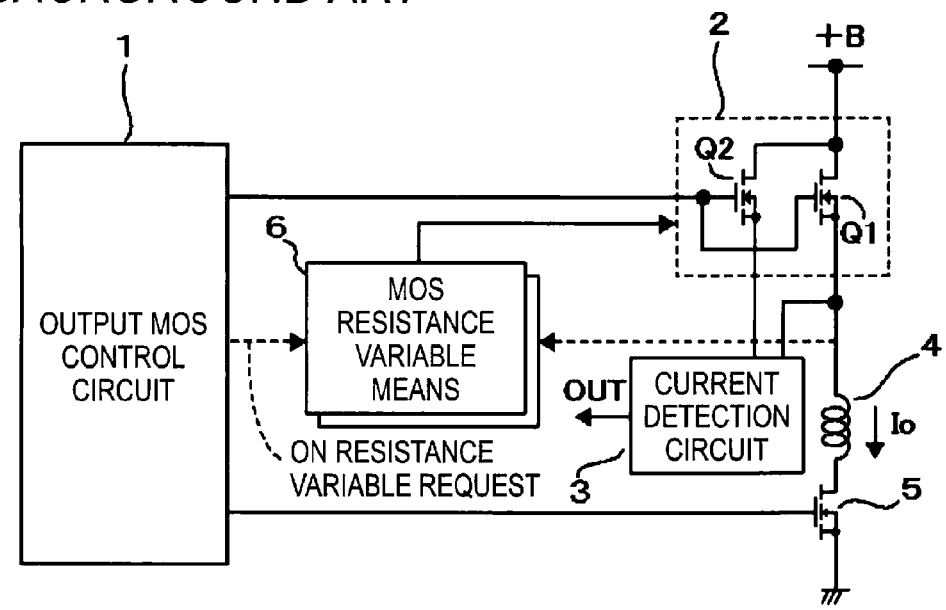
FIG. 11 is another circuit configuration diagram showing a related art.

Further, FIG. 9 is an example of a detailed circuit diagram of the current determination circuit 7b according to the illustrative embodiment 4. The current determination circuit 7b shown in FIG. 9 includes logic circuits NAND1 to NANDn−1, delay circuits DL1 to DLn−1, hysteresis comparators CP1 to CPn and reference voltage sources Vr1 to Vrn. The voltages of the reference voltage sources Vr1 to Vrn are represented by Vr1>Vr2>Vr3> . . . >Vrn. The reference voltage source Vr1 is connected to an inverting terminal of the hysteresis comparator CP1 and the output voltage Vs1 of the first current detection part Cd1 is inputted to a non-inverting terminal of the hysteresis comparator CP1. An output of the hysteresis comparator CP1 is connected to the control terminal of the switch S1 and one input terminal of the logic circuit NAND1 via the second drive circuit Dr2 and the delay circuit DL1. An output of the hysteresis comparator CP2 is connected to the other input terminal of the logic circuit NAND1. An output of the logic circuit NAND1 is connected to the control terminal of the switch S2.

Further, the reference voltage source Vr2 is connected to an inverting terminal of the hysteresis comparator CP2, and the output voltage Vs2 of the first current detection part is inputted to a non-inverting terminal of the hysteresis comparator CP2. An output of the hysteresis comparator CP2 is connected to one input terminal of the logic circuit NAND2 via the third drive circuit Dr3 and the delay circuit DL2. An output of the hysteresis comparator CP3 is connected to the other input terminal of the logic circuit NAND2. An output of the logic circuit NAND2 is connected to the control terminal of the switch S3.

Similarly to the above, the logic circuit NANDn−1, the delay circuit DLn−1, the hysteresis comparator CPn and the reference voltage source Vrn are connected.

The current determination circuit 7b shown in FIG. 9 is set so that the hysteresis comparators CP1 to CPn output a low-level control signal in accordance with the magnitude of the detection voltages Vs1 to Vsn from the first current detection part Cd1 to the Nth current detection part Cdn. That is, when the load current is decreased and thus the hysteresis comparators CP1 outputs a low-level control signal, any one of the second current detection part Cd2, the third current detection part Cd3, . . . , the Nth current detection part Cdn is driven in accordance with the magnitude of the load current Io.

Next, an operation of the illustrative embodiment 4 in case that the load current Io is decreased is described. In a case where the load current Io is decreased and thus the hysteresis comparators CP1 outputs a low-level control signal, the switch S1 is opened and the second drive circuit Dr2 is turned off, so that the second current detection part Cd2 is operated and also the low-level control signal is inputted to one terminal of the logic circuit NAND1 via the delay circuit DL1. At this time, since a high-level control signal outputted from the hysteresis comparators CP2 is inputted to the other terminal of the logic circuit NAND1, the switch S2 is closed and thus the detection result of the second current detection part Cd2 is outputted to the current detection output terminal 105.

Furthermore, when the load current Io is decreased and the current determination circuit 7b detects the decrease of the load current Io, the hysteresis comparators CP2 outputs a low-level control signal, the switch S2 is opened and the third drive circuit Dr3 is turned off, so that the third current detection part Cd3 is operated and also the low-level control signal is inputted to one terminal of the logic circuit NAND2 via the delay circuit DL2. At this time, since a high-level control signal outputted from the hysteresis comparators CP3 is inputted to the other terminal of the logic circuit NAND2, the output of the NAND becomes high and thus the switch S3 is closed, so that the detection result of the third current detection part Cd3 is outputted to the current detection output terminal 105.

As the load current Io is decreased, the current determination circuit 7b switches the current detection part from the first current detection part Cd1 toward the Nth current detection part Cdn. As a result, it is possible to obtain the characteristic diagram of load current-current detection accuracy shown in FIG. 6.

In addition to obtaining the same effects as in the illustrative embodiment 2, a current detection circuit 3d according to the present illustrative embodiment 4 can provide a high-accuracy output signal of the current detection parts Cd1 to Cdn to the current determination circuit 7b in accordance with the magnitude of the load current Io, as shown in FIG. 6. Accordingly, it is possible to obtain a stable switching operation of the current detection parts Cd1 to Cdn relative to the load current.

Illustrative embodiments of this disclosure have been described. However, this disclosure is not limited to the specific illustrative embodiments, but various modifications and changes can be made within the scope of this disclosure described in the claims. For example, the configuration of the illustrative embodiment 4 may be employed in the illustrative embodiment 3. Further, the current determination circuit 7 of the illustrative embodiments 2 and 3 may be substituted with the current determination circuit 7a shown in the application example of the illustrative embodiment 1.

What is claimed is:
1. A current detection circuit provided in a load driving circuit that includes a first semiconductor device, which is turned on/off to control current flowing through the load based on a signal and is connected in series in a power supply path from a DC power supply to a load, and a first drive circuit configured to drive the first semiconductor device to be turned on/off based on the signal, wherein the current detection circuit is configured to convert current into voltage and output the converted voltage in accordance with the current flowing through the first semiconductor device, wherein the current detection circuit comprises:
- a series circuit of a first current detection part and a second current detection part, which detects current having a smaller range than the first current detection part;
- a second semiconductor device, which is provided with a second drive circuit, connected in parallel with the second current detection part; and
- a current determination circuit configured to switch between the first current detection part and the second current detection part, based on the magnitude of the detection current of the first current detection part, and to output voltage based on one of the first current detection part and the second current detection part,
- wherein, when the detection current of the first current detection part is larger than a predetermined value, the current determination circuit controls the second semiconductor device to be turned on via the second drive circuit and control the second current detection part to be short-circuited, so that the voltage from the first current detection part is output, and
- wherein, when the detection current of the first current detection part is smaller than the predetermined value, the current determination circuit controls the second semiconductor device to be turned off, so that the voltage from the second current detection part is output.

2. The current detection circuit according to claim 1,
- wherein the first current detection part includes a third semiconductor device, which has the same structure as the first semiconductor device and has an area different from the first semiconductor device, and which is driven synchronously with on-drive of the first semiconductor device to flow current proportional to the current flowing through the first semiconductor device, and
- wherein the first current detection part converts the current flowing through the third semiconductor device into voltage and outputs.

3. The current detection circuit according to claim 1,
- wherein the output of the first current detection part is connected to an output terminal of the current detection circuit via a first switch,
- wherein the output of the second current detection part is connected to the output terminal of the current detection circuit via a second switch,
- wherein the current determination circuit compares an output voltage of the first current detection part with a predetermined reference voltage,
- wherein, when the output voltage of the first current detection part is higher than the reference voltage, the current determination circuit controls the second semiconductor device to be turned on via the second drive circuit and closes the first switch to output the output voltage to the output terminal of the current detection circuit,
- wherein, when the output voltage of the first current detection part is lower than the reference voltage, the current determination circuit controls the second semiconductor device to be turned off via the second drive circuit and closes the second switch to output the output voltage to the output terminal of the current detection circuit, and
- wherein the output is outputted from one of the first current detection part and the second current detection part by closing one of the switches.

4. A current detection circuit provided in a load driving circuit that includes a first semiconductor device, which is turned on/off to control current flowing through the load based on a signal and is connected in series in a power supply path from a DC power supply to a load, and a first drive circuit configured to drive the first semiconductor device to be turned on/off based on the signal, wherein the current detection circuit is configured to convert current into voltage and output the converted voltage in accordance with the current flowing through the first semiconductor device, wherein the current detection circuit comprises:
- a series circuit of a first current detection part and a plurality of current detection parts, which sequentially detects current having a smaller range than the first current detection part;
- a plurality of semiconductor devices, each of which is provided with a plurality of drive circuits, respectively connected in parallel with the plurality of current detection parts; and
- a current determination circuit configured to switch to any one of the first current detection part and the plurality of current detection parts, based on the magnitude of the detection current of the first current detection part, and to output voltage based on any one of the first current detection part and the plurality of current detection parts,
- wherein, when the detection current of the first current detection part is larger than a predetermined value, the current determination circuit controls the plurality of semiconductor devices to be turned on via each of the plurality of drive circuits and control the plurality of current detection parts to be respectively short-circuited, so that the voltage from the first current detection part is output, and
- wherein, when the detection current of the first current detection part is smaller than the predetermined value, the current determination circuit controls any one the plurality of semiconductor devices to be turned off in accordance with the detection current of the first current detection part, so that the voltage from a corresponding current detection part of the plurality of current detection parts is output.

5. A current detection circuit provided in a load driving circuit that includes a first semiconductor device, which is turned on/off to control current flowing through the load based on a signal and is connected in series in a power supply path from a DC power supply to a load, and a first drive circuit configured to drive the first semiconductor device to be turned on/off based on the signal, wherein the current detection circuit is configured to convert current into voltage and output the converted voltage in accordance with the current flowing through the first semiconductor device, wherein the current detection circuit comprises:
- a series circuit of a first current detection part and a plurality of current detection parts, which sequentially detects current having a smaller range than the first current detection part;
- a plurality of semiconductor devices, each of which is provided with a plurality of drive circuits, respectively connected with the plurality of current detection parts; and
- a current determination circuit configured to switch to any one of the first current detection part and the plurality of current detection parts, based on the magnitude of the detection current of the first current detection part, and to output voltage based on any one of the first current detection part and the plurality of current detection parts,
- wherein, when the detection current of the first current detection part is larger than a predetermined value, the current determination circuit controls the plurality of semiconductor devices to be turned on via each of the plurality of drive circuits and control the plurality of current detection parts to be respectively short-circuited, so that the voltage from the first current detection part is output, and wherein, when the detection current of the first current detection part is smaller than the predetermined value, the current determination circuit controls any one the plurality of semiconductor devices to be turned off in accordance with the detection current of the first current detection part, so that the voltage from a corresponding current detection part of the plurality of current detection parts is output.

6. The current detection circuit according to claim 4, wherein the first current detection part includes a third semiconductor device, which has the same structure as the first semiconductor device and has an area different from the first semiconductor device, and which is driven synchronously with on-drive of the first semiconductor device to flow current proportional to the current flowing through the first semiconductor device, and wherein the first current detection part converts the current flowing through the third semiconductor device into voltage and outputs.

7. The current detection circuit according to claim 4, wherein the output of the first current detection part is connected to an output terminal of the current detection circuit via a first switch, wherein the output of the plurality of current detection parts is connected to the output terminal of the current detection circuit via each of a plurality of switches, wherein the current determination circuit compares an output voltage of the first current detection part with a predetermined reference voltage, wherein, when the output voltage of the first current detection part is higher than the reference voltage, the current determination circuit controls the plurality of semiconductor devices to be turned on via the plurality of drive circuits and closes the first switch to output the output voltage to the output terminal of the current detection circuit, wherein, when the output voltage of the first current detection part is lower than the reference voltage, the current determination circuit controls any one of the plurality of semiconductor devices to be turned off via the plurality of drive circuits and closes a corresponding switch of the plurality of switches to output the output voltage to the output terminal of the current detection circuit, and wherein the output is outputted from one of the first current detection part and the plurality of current detection parts by closing one of the switches.

8. The current detection circuit according to claim 4, wherein the switching between the first current detection part and the plurality of current detection parts in the current determination circuit is carried out at a constant voltage interval, based on the output voltage of the first current detection part.

9. The current detection circuit according to claim 4, wherein the switching between the first current detection part and the plurality of current detection parts in the current determination circuit is carried out so that a voltage interval for sequentially switching of the plurality of current detection parts becomes larger as the output voltage is decreased, based on the output voltage of the first current detection part.

10. A current detection circuit provided in a load driving circuit that includes a first semiconductor device, which is turned on/off to control current flowing through the load based on a signal and is connected in series in a power supply path from a DC power supply to a load, and a first drive circuit configured to drive the first semiconductor device to be turned on/off based on the signal, wherein the current detection circuit is configured to convert current into voltage and output the converted voltage in accordance with the current flowing through the first semiconductor device, wherein the current detection circuit comprises:

a series circuit of a first current detection part and a plurality of current detection parts, which sequentially detects current having a smaller range than the first current detection part, a plurality of semiconductor devices, each of which is provided with a plurality of drive circuits, respectively connected in parallel with the plurality of current detection parts, a current determination circuit configured to sequentially switch from the first current detection part to each of the plurality of current detection parts, based on the magnitude of the detection current from the first current detection part to each of the plurality of current detection part, and to output voltage based on any one of the first current detection part and the plurality of current detection parts, wherein, when the detection current of the first current detection part is larger than a predetermined value, the current determination circuit controls the plurality of semiconductor devices to be turned on via each of the plurality of drive circuits and controls the plurality of current detection parts to be respectively short-circuited, so that the voltage from the first current detection part is output, and wherein, when the detection current of from the first current detection part to each of the plurality of current detection parts is smaller than a characteristic value corresponding to the first current detection part to each of the plurality of current detection parts, the current determination circuit controls the semiconductor device connected in parallel with a next stage current detection part having a smaller current detection range to be turned off, so that the voltage from the next stage current detection part having the smaller current detection range is output.

* * * * *